(12) United States Patent
Kim et al.

(10) Patent No.: US 10,580,800 B2
(45) Date of Patent: *Mar. 3, 2020

(54) THIN FILM TRANSISTOR AND ORGANIC LIGHT EMITTING DIODE DISPLAY INCLUDING THE SAME

(71) Applicant: Samsung Display Co., Ltd., Yongin, Gyeonggi-Do (KR)

(72) Inventors: Jung-Bae Kim, Yongin (KR); Bo-Yong Chung, Yongin (KR); Hai-Jung In, Yongin (KR); Dong-Gyu Kim, Yongin (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/791,492

(22) Filed: Oct. 24, 2017

(65) Prior Publication Data

US 2018/0061860 A1 Mar. 1, 2018

Related U.S. Application Data

(63) Continuation of application No. 14/055,039, filed on Oct. 16, 2013, now Pat. No. 9,818,766.

(30) Foreign Application Priority Data

May 31, 2013 (KR) .......................... 10-2013-0062968

(51) Int. Cl.
*H01L 27/12* (2006.01)
*H01L 29/423* (2006.01)
(Continued)

(52) U.S. Cl.
CPC ...... *H01L 27/124* (2013.01); *H01L 29/42384* (2013.01); *H01L 29/78645* (2013.01); *H01L 27/3262* (2013.01); *H01L 27/3265* (2013.01)

(58) Field of Classification Search
CPC ............... H01L 27/124; H01L 27/3262; H01L 27/3265; H01L 29/42384; H01L 29/78645
(Continued)

(56) References Cited

U.S. PATENT DOCUMENTS 5,672,888 A * 9/1997 Nakamura ........ G02F 1/136213
257/408
7,667,287 B2 * 2/2010 You ..................... H01L 27/1214
257/439
(Continued)

FOREIGN PATENT DOCUMENTS

KR 1998-023376 A 7/1998
KR 1998-023377 A 7/1998
(Continued)

*Primary Examiner* — Mohammed Shamsuzzaman
(74) *Attorney, Agent, or Firm* — Cantor Colburn LLP

(57) ABSTRACT

A thin film transistor includes a substrate, a semiconductor layer on the substrate, a first insulating layer covering the substrate and the semiconductor layer, a first gate electrode on the first insulating layer and overlapping the semiconductor layer, a second insulating layer covering the first gate electrode and the first insulating layer, a second gate electrode on the second insulating layer and overlapping the semiconductor layer and the first gate electrode, a third insulating layer covering the second gate electrode, a first contact hole defined in the first insulating layer, the second insulating layer and the third insulating layer, and through which a portion of the semiconductor layer is exposed, and a source electrode and a drain electrode connected to the semiconductor layer through the first contact hole.

11 Claims, 6 Drawing Sheets

(51) Int. Cl.
*H01L 29/786* (2006.01)
*H01L 27/32* (2006.01)

(58) Field of Classification Search
USPC ........ 257/40, 74, 66; 438/689, 222; 345/100
See application file for complete search history.

(56) References Cited

U.S. PATENT DOCUMENTS

| | | | |
|---|---|---|---|
| 9,318,513 B2* | 4/2016 | Nakano | G02F 1/136209 |
| 2001/0009283 A1* | 7/2001 | Arao | G02F 1/13454 |
| | | | 257/303 |
| 2002/0008240 A1 | 1/2002 | Hirabayashi et al. | 257/74 |
| 2002/0142554 A1* | 10/2002 | Nakajima | H01L 29/4908 |
| | | | 438/301 |
| 2002/0145141 A1* | 10/2002 | Chen | H01L 29/66757 |
| | | | 257/66 |
| 2003/0132523 A1* | 7/2003 | Ohtani | H01L 23/53223 |
| | | | 257/758 |
| 2004/0063270 A1* | 4/2004 | Ishikawa | H01L 27/1214 |
| | | | 438/222 |
| 2004/0224514 A1 | 11/2004 | Uehara et al. | 438/689 |
| 2004/0227195 A1* | 11/2004 | Chang | H01L 29/66757 |
| | | | 257/408 |
| 2005/0258423 A1* | 11/2005 | Kuwabara | H01L 27/1214 |
| | | | 257/66 |
| 2006/0097258 A1* | 5/2006 | Yamazaki | H01L 29/42384 |
| | | | 257/59 |
| 2007/0002195 A1* | 1/2007 | Cho | G02F 1/136227 |
| | | | 349/43 |
| 2007/0117239 A1* | 5/2007 | Ishi | H01L 27/1214 |
| | | | 438/30 |
| 2007/0228426 A1* | 10/2007 | Iriguchi | H01L 27/283 |
| | | | 257/288 |
| 2008/0018566 A1* | 1/2008 | Yamauchi | H01L 27/1251 |
| | | | 345/76 |
| 2008/0048189 A1* | 2/2008 | Yamazaki | H01L 29/42384 |
| | | | 257/66 |
| 2008/0062112 A1 | 3/2008 | Umezaki | 345/100 |
| 2013/0021544 A1 | 1/2013 | Fukuyama et al. | |

FOREIGN PATENT DOCUMENTS

| | | |
|---|---|---|
| KR | 100186090 B1 | 3/1999 |
| KR | 1020110103736 A | 9/2011 |
| TW | 491985 B | 6/2002 |
| TW | 200518346 A | 6/2005 |
| WO | 2011122352 A1 | 10/2011 |

* cited by examiner

THIN FILM TRANSISTOR AND ORGANIC LIGHT EMITTING DIODE DISPLAY INCLUDING THE SAME

This application is a continuation application of U.S. application Ser. No. 14/055,039 filed Oct. 16, 2013, which claims priority to Korean Patent Application No. 10-2013-0062968 filed on May 31, 2013, and all the benefits accruing therefrom under 35 U.S.C. § 119, the entire contents of which are incorporated herein by reference.

BACKGROUND

(a) Field

The invention relates to a thin film transistor and an organic light emitting diode display including the same.

(b) Description of the Related Art

An organic light emitting diode display includes two electrodes and an organic light emitting layer positioned therebetween. Electrons injected from a cathode that is one of the two electrodes and holes injected from an anode that is the other of the two electrodes are bonded to each other in the organic light emitting layer to form an exciton. Light is emitted while the exciton discharges energy.

The organic light emitting diode display includes a plurality of pixels each including an organic light emitting diode formed of the cathode, the anode and the organic light emitting layer. A plurality of thin film transistors ("TFTs") and capacitors for driving the organic light emitting diode are disposed in each pixel. The plurality of TFTs includes a switching TFT and a driving TFT.

SUMMARY

One or more exemplary embodiment provides a thin film transistor in which a leakage current is minimized, and an organic light emitting diode display including the same.

An exemplary embodiment provides a thin film transistor including a substrate. A semiconductor layer is on the substrate. A first insulating layer covers the substrate and the semiconductor layer. A first gate electrode is on the first insulating layer and overlaps the semiconductor layer. A second insulating layer covers the first gate electrode and the first insulating layer. A second gate electrode is on the second insulating layer and overlaps the semiconductor layer and the first gate electrode. A third insulating layer covers the second gate electrode. A first contact hole is defined in the first insulating layer, the second insulating layer and the third insulating layer, and exposes a portion of the semiconductor layer. A source electrode and a drain electrode are on the third insulating layer, and connected to the semiconductor layer through the first contact hole. An overall length of the second gate electrode is larger than an overall length of the first gate electrode.

The first gate electrode may be between the second gate electrode and the substrate.

The thin film transistor may further include a second contact hole defined in the second insulating layer, and through which a portion of the first gate electrode is exposed. The second gate electrode may be connected to the first gate electrode through the second contact hole.

The second gate electrode may include an overlapping second gate unit overlapping the first gate electrode, and a non-overlapping second gate unit exposed by the first gate electrode.

The semiconductor layer may include a source region in contact with the source electrode, a drain region in contact with the drain electrode, a channel region between the source region and the drain region, and a weak electric field region overlapping the non-overlapping second gate unit.

The weak electric field region may be between the source region and the channel region and between the drain region and the channel region.

The first gate electrode may include a first sub-gate electrode and a second sub-gate electrode spaced apart from each other.

Both the first sub-gate electrode and the second sub-gate electrode may be between the second gate electrode and the substrate.

The semiconductor layer may further include a central weak electric field region between the first sub-gate electrode and the second sub-gate electrode, in a plan view.

The thin film transistor may further include a third contact hole defined in the third insulating layer, and through which a portion of the second gate electrode is exposed, and a low resistance member on the third insulating layer, overlapping the second gate electrode and connected to the second gate electrode through the third contact hole.

Another exemplary embodiment provides a thin film transistor including a substrate. A semiconductor layer is on the substrate. A first insulating layer covers the substrate and the semiconductor layer. A first gate electrode is on the first insulating layer and overlaps the semiconductor layer. A second insulating layer covers the first gate electrode and the first insulating layer. A second gate electrode is on the second insulating layer and overlaps the semiconductor layer and the first gate electrode. A third insulating layer covers the second gate electrode. A first contact hole is defined in the first insulating layer, the second insulating layer and the third insulating layer, and exposes a portion of the semiconductor layer. A source electrode and a drain electrode are on the third insulating layer, and connected to the semiconductor layer through the first contact hole. The first gate electrode includes a first sub-gate electrode and a second sub-gate electrode spaced apart from each other. An overall length of the second gate electrode is smaller than an overall length of the first gate electrode.

The semiconductor layer may include a source region in contact with the source electrode, a drain region in contact with the drain electrode, a channel region between the source region and the drain region, and a central weak electric field region overlapping an interval between the first sub-gate electrode and the second sub-gate electrode, in a plan view.

The thin film transistor may further include a second contact hole defined in the second insulating layer, and through which a portion of the first gate electrode is exposed, and the second gate electrode may be connected to the first gate electrode through the second contact hole.

The thin film transistor may further include a third contact hole defined in the third insulating layer, and through which a portion of the second gate electrode is exposed, and a low resistance member on the third insulating layer, overlapping the second gate electrode and connected to the second gate electrode through the third contact hole.

Yet another exemplary embodiment provides an organic light emitting diode display including a substrate. A thin film transistor and a capacitor are on the substrate. An organic light emitting diode is connected to the thin film transistor.

The thin film transistor includes a semiconductor layer on the substrate. A first insulating layer covers the substrate and the semiconductor layer. A first gate electrode is on the first insulating layer and overlaps the semiconductor layer. A second insulating layer covers the first gate electrode and the first insulating layer. A second gate electrode is on the second insulating layer and overlaps the semiconductor layer and the first gate electrode. A third insulating layer covers the second gate electrode. A first contact hole is defined in the first insulating layer, the second insulating layer and the third insulating layer, and exposes a portion of the semiconductor layer. A source electrode and a drain electrode are on the third insulating layer, and connected to the semiconductor layer through the first contact hole. An overall length of the second gate electrode is larger than an overall length of the first gate electrode.

The thin film transistor may further include a second contact hole defined in the second insulating layer, and through which a portion of the first gate electrode is exposed, and the second gate electrode may be connected to the first gate electrode through the second contact hole.

The second gate electrode may include an overlapping second gate unit overlapping the first gate electrode and a non-overlapping second gate unit exposed by the first gate electrode.

The semiconductor layer may include a source region in contact with the source electrode, a drain region in contact with the drain electrode, a channel region between the source region and the drain region, and a weak electric field region overlapping the non-overlapping second gate unit.

The weak electric field region may be between the source region and the channel region and between the drain region and the channel region.

The capacitor may include a first capacitor plate in a same layer as the first gate electrode, a second capacitor plate in a same layer as the second gate electrode, and a third capacitor plate in a same layer as the source electrode and the drain electrode. The first capacitor plate, the second capacitor plate and the third capacitor plate may overlap each other.

According to one or more exemplary embodiment, a second gate electrode includes a portion exposed by a first gate electrode, and a second gate electrode is connected to the first gate electrode through a contact hole defined in a second insulating layer. Accordingly, a weak electric field region of the semiconductor layer and overlapping the second gate electrode exhibits an effect similar to that of a lightly doped drain ("LDD") structure. Therefore, a leakage of electrical current and a hot electron effect can be reduced, and a breakdown voltage can be increased.

Further, an on-current is increased in a channel region of the thin film transistor where a strong electric field is formed. Therefore, a capacitor in a pixel of a large-area display device can be charged.

Further, the weak electric field region is included in the semiconductor layer of the organic light emitting diode display including the thin film transistor according to one or more exemplary embodiment. Therefore, the leakage of electrical current of the thin film transistor can be reduced to maintain a voltage applied to the capacitor connected to the thin film transistor, during one frame.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

Figure 1:
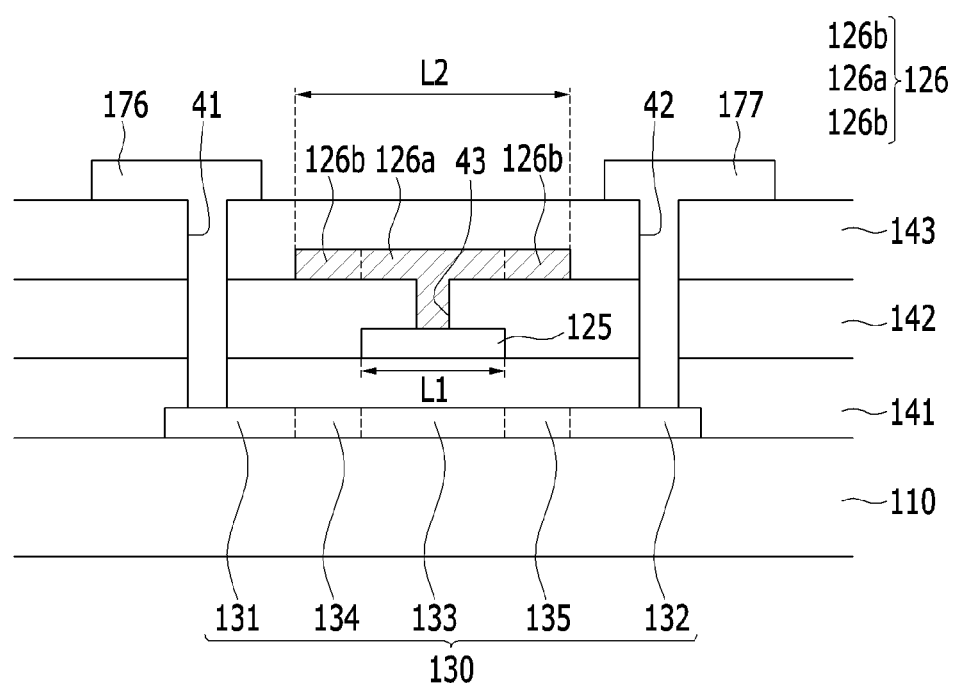
FIG. 1 is a cross-sectional view of an exemplary embodiment of a thin film transistor according to the invention.

Hereinafter, exemplary embodiments of the invention will be described in detail with reference to the accompanying drawings so that those skilled in the art may easily practice the invention. As those skilled in the art would realize, the described embodiments may be modified in various different ways, all without departing from the spirit or scope of the invention.

In addition, in various exemplary embodiments, the same reference numerals are used with respect to the constituent elements having the same constitution and illustrated in one exemplary embodiment, and in an alternative exemplary embodiment, only elements that are different from the one exemplary embodiment are illustrated.

In describing the disclosure, parts that are not related to the description will be omitted. Like reference numerals generally designate like elements throughout the specification.

In addition, the size and thickness of each element shown in the drawings are arbitrarily shown for understanding and ease of description, but the invention is not limited thereto. As used herein, the term "and/or" includes any and all combinations of one or more of the associated listed items.

In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When the organic light emitting diode display is driven, when leakage of electrical current is leaked associated with a capacitor connected to the switching thin film transistor ("TFT"), a size of the capacitor is increased to increase a capacity of the capacitor or a frame frequency is increased to reduce a time of one frame in order to maintain a constant voltage during the time of one frame. Thereby, a change in voltage due to the leakage current is relieved.

However, when the capacity of the capacitor is increased in order to maintain the constant voltage during the time of one frame, the increased capacity acts as a load during charging or discharging of the capacitor. Accordingly, it is difficult to ensure charging and discharging times, and an aperture ratio of the pixel is reduced. Further, when the frame frequency is increased in order to maintain the constant voltage during the time of one frame, input of data within a predetermined time due to a load connected to a data line and a scan line may be difficult.

As shown in a transfer curve of a typical P-type TFT, when a gate voltage ($V_{GS}$) is increased as a positive number, the leakage current is increased. When a drain voltage ($V_{DS}$) is increased as a negative number, the leakage current is further increased. Accordingly, in the switching TFT disposed in the pixel of the organic light emitting diode display, when the gate voltage $V_{GS}$ is increased as the positive number and the switching TFT is in an off state, the drain voltage ($V_{DS}$) is increased as the negative number. Therefore, the leakage current is increased in a condition where a large voltage is applied, and thus a change in voltage applied to the capacitor is intensified.

In order to reduce the leakage current, a lightly doped drain ("LDD") structure where a lightly doped region (n−) is interposed between opposing highly doped source and drain regions (n+), and a channel is applied to the TFT of the organic light emitting diode display. In a process of providing a top gate type TFT, the LDD structure includes a gate electrode formed according to a self alignment method. The LDD structure provided in the top gate type TFT reduces the leakage current and a hot electron effect, and increases a breakdown voltage.

However, when the LDD structure is provided, an electrical on-current (Ion) is reduced and costs are increased due to use of an additional mask.

The top gate type TFT typically includes a semiconductor layer including polysilicon, a gate insulating layer covering the semiconductor layer, a gate electrode disposed on the gate insulating layer and partially overlapping the semiconductor layer, an interlayer insulating layer covering the gate electrode and the gate insulating layer, and source and drain electrodes connected to the semiconductor layer exposed through a contact hole defined in the interlayer insulating layer and the gate insulating layer. In the top gate TFT, when a cross-sectional thickness of the gate insulating layer is increased, an electric field respectively between the gate electrode, and the source and drain electrodes may be reduced to reduce the leakage current. However, the on-current may be reduced due to an increase in resistance, and thus a capacitor in a pixel of a large-area display device may not be charged.

Hereinafter, the invention will be described in detail with reference to the accompanying drawings.

Then, a TFT according to the invention will be described in detail with reference to FIG. 1.

FIG. 1 is a cross-sectional view of an exemplary embodiment of a TFT according to the invention.

As shown in FIG. 1, in the TFT, a semiconductor layer 130 is disposed on a substrate 110 including transparent glass or plastic. The semiconductor layer 130 may include a polysilicon (poly-Si) or oxide semiconductor. The oxide semiconductor may include an oxide including titanium (Ti), hafnium (Hf), zirconium (Zr), aluminum (Al), tantalum (Ta), germanium (Ge), zinc (Zn), gallium (Ga), tin (Sn), or indium (In) as a basis, and complex oxides thereof, such as zinc oxide ("ZnO"), indium-gallium-zinc oxide ("In—Ga—Zn—O"), indium-zinc oxide ("Zn—In—O"), zinc-tin oxide ("Zn—Sn—O)", indium-gallium oxide ("In—Ga—O"), indium-tin oxide ("In—Sn—O"), indium-zirconium oxide ("In—Zr—O"), indium-zirconium-zinc oxide ("In—Zr—Zn—O"), indium-zirconium-tin oxide ("In—Zr—Sn—O"), indium-zirconium-gallium oxide ("In—Zr—Ga—O"), indium-aluminum oxide ("In—Al—O"), indium-zinc-aluminum oxide ("In—Zn—Al—O"), indium-tin-aluminum oxide ("In—Sn—Al—O"), indium-aluminum-gallium oxide ("In—Al—Ga—O"), indium-tantalum oxide ("In—Ta—O"), indium-tantalum-zinc oxide ("In—Ta—Zn—O"), indium-tantalum-tin oxide ("In—Ta—Sn—O"), indium-tantalum-gallium oxide ("In—Ta—Ga—O"), indium-germanium oxide ("In—Ge—O"), indium-germanium-zinc oxide ("In—Ge—Zn—O"), indium-germanium-tin oxide ("In—Ge—Sn—O"), indium-germanium-gallium oxide ("In—Ge—Ga—O"), titanium-indium-zinc oxide ("Ti—In—Zn—O"), and hafnium-indium-zinc oxide ("Hf—In—Zn—O"). When the semiconductor layer 130 includes the oxide semiconductor, a separate protective layer (not shown) may be added to protect the oxide semiconductor that is weak to an external environment such as high temperatures.

The semiconductor layer 130 includes a source region 131, a drain region 132, a channel region 133 positioned between the source region 131 and the drain region 132, and weak electric field regions 134 and 135 positioned between the source region 131 and the channel region 133 and between the drain region 132 and the channel region 133.

The weak electric field regions 134 and 135 respectively separate the source region 131 and the channel region 133, and the drain region 132 and the channel region 133. As described above, the weak electric field regions 134 and 135 are disposed between the source region 131 and the channel region 133 and between the drain region 132 and the channel region 133. Accordingly, when the TFT is in an off-state, an electron movement path in the semiconductor layer 130 may be blocked to reduce or effectively prevent a leakage of electrical current from occurring.

A first insulating layer 141 including silicon nitride (SiNx) or silicon oxide (SiOx) is disposed on the substrate 110 and the semiconductor layer 130. A first gate electrode 125 is disposed on the first insulating layer 141. The first gate electrode 125 is positioned to overlap the channel region 133. The first gate electrode 125 is connected to a gate line (not shown) transmitting a gate signal.

A second insulating layer 142 including silicon nitride (SiNx) or silicon oxide (SiOx) is disposed on the first gate electrode 125 and the first insulating to layer 141. The second insulating layer 142 covers the first gate electrode 125 to insulate the first gate electrode 125 from other elements of the TFT.

A second gate electrode 126 is disposed on the second insulating layer 142. The second gate electrode 126 is positioned to overlap the first gate electrode 125 in a plan view. An overall length L2 of the second gate electrode 126 may be larger than an overall length L1 of the first gate electrode 125. The first gate electrode 125 is disposed in an internal side of the second gate electrode 126, where the internal side refers to a side closer to the substrate 110. The second gate electrode 126 includes an overlapping second gate unit 126a overlapping the first gate electrode 125 in the plan view, and a non-overlapping second gate unit 126b not overlapping (e.g., exposed by) the first gate electrode 125 in the plan view. The weak electric field regions 134 and 135 of the semiconductor layer 130 are disposed at a position corresponding to a plurality of non-overlapping second gate units 126b, respectively. A contact hole 43 is defined in the second insulating layer 142 and exposes the first gate electrode 125. The second gate electrode 126 is physically and/or electrically connected to the first gate electrode 125 through the contact hole 43, which extends completely through a cross-sectional thickness of the second insulating layer 142 and exposes the first gate electrode 125.

Accordingly, when a scan signal is applied to the first gate electrode 125 and the second gate electrode 126, only the first insulating layer 141 is disposed between the channel region 133 of the semiconductor layer 130, and the first gate electrode 125 which overlaps both the overlapping second gate unit 126a of the second gate electrode 126 and the channel region 133. Therefore, a relatively strong electric field is formed between the first gate electrode 125 and the channel region 133 of the semiconductor layer 130. The first insulating layer 141 and the second insulating layer 142 are disposed between the non-overlapping second gate unit 126b of the second gate electrode 126, and the weak electric field regions 134 and 135 of the semiconductor layer 130. Therefore, a relatively weak electric field is formed between the non-overlapping second gate unit 126b of the second gate electrode 126, and the weak electric field regions 134 and 135 of the semiconductor layer 130.

As described above, the weak electric field regions 134 and 135 exhibit an effect similar to that of an LDD structure. Accordingly, when the TFT is in an off-state, an electron movement path of the semiconductor layer 130 is blocked to reduce or effectively prevent a leakage of electrical current and a hot electron effect, and increase a breakdown voltage. Further, an on-current is increased in the channel region 133 of the TFT where the strong electric field is formed. Therefore, a capacitor in a pixel of a large-area display device can be effectively charged.

As described above, the second gate electrode 126 having a portion not overlapping (e.g., exposed by) the first gate electrode 125 is disposed in the TFT, and the second gate electrode 126 is connected to the first gate electrode 125 through the contact hole 43 extended through the second insulating layer 142. Accordingly, the weak electric field regions 134 and 135 may be disposed in the semiconductor layer 130 to exhibit the effect similar to that of the LDD structure, thus reducing the leakage current and the hot electron effect, and increasing the breakdown voltage.

A third insulating layer 143 including silicon nitride (SiNx) or silicon oxide (SiOx) is disposed on the second gate electrode 126 and the second insulating layer 142. The third insulating layer 143 covers the second gate electrode 126 to insulate the second gate electrode 126 from other elements of the TFT.

A source electrode 176 and a drain electrode 177 are disposed the third insulating layer 143. Contact holes 41 and 42 are defined in the first insulating layer 141, the second insulating layer 142, and the third insulating layer 143. The source electrode 176 and the drain electrode 177 are connected to the source region 131 and the drain region 132 of the semiconductor layer 130, through the contact holes 41 and 42 which are extended completely through cross-sectional thicknesses of each of the first insulating layer 141, the second insulating layer 142 and the third insulating layer 143, through which the source region 131 and the drain region 132 of the semiconductor layer 130 are exposed, respectively.

An organic light emitting diode display including a TFT according to the invention will be described below in detail with reference to FIG. 2.

Figure 2:
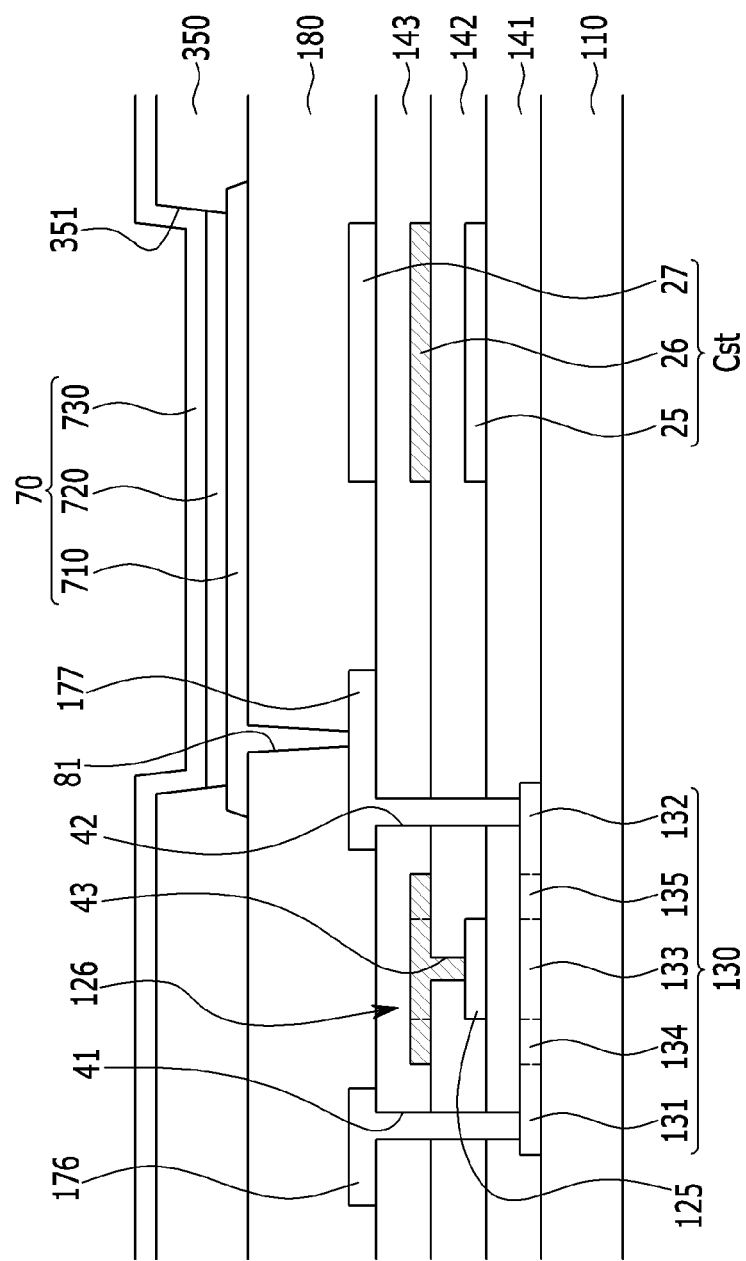
FIG. 2 is a cross-sectional view of an exemplary embodiment of an organic light emitting diode display including a thin film transistor according to the invention.

FIG. 2 is a cross-sectional view of an exemplary embodiment of an organic light emitting diode display including a TFT according to the invention.

As shown in FIG. 2, the first gate electrode 125 and a first capacitor plate 25 are disposed on the first insulating layer 141 of the TFT shown in FIG. 1, but the invention is not limited thereto. The first gate electrode 125 and the first capacitor plate 25 may be in and/or on a same layer of the organic light emitting diode display. The second insulating layer 142 is disposed on the first gate electrode 125, the first capacitor plate 25 and the first insulating layer 141. The second gate electrode 126 and a second capacitor plate 26 are disposed on the second insulating layer 142. The second gate electrode 126 and the second capacitor plate 26 may be in and/or on a same layer of the organic light emitting diode display. The third insulating layer 143 is disposed on the second gate electrode 126, the second capacitor plate 26 and the second insulating layer 142. The source electrode 176, the drain electrode 177 and a third capacitor plate 27 are disposed on the third insulating layer 143. The source electrode 176, the drain electrode 177 and the third capacitor plate 27 may be in and/or on a same layer of the organic light emitting diode display. The first capacitor plate 25, the second capacitor plate 26 and the third capacitor plate 27 overlap each other to collectively form a capacitor Cst.

As described above, the organic light emitting diode display includes the capacitor Cst including the second capacitor plate 26 disposed in and/or on the same layer as the second gate electrode 126. Accordingly, a capacity of the capacitor Cst may be increased to maintain a voltage applied to the capacitor Cst during one frame.

A protective layer 180 is disposed on the source electrode 176, the drain electrode 177, the third capacitor plate 27 and the third insulating layer 143. A contact hole 81 is defined in the protective layer 180. A pixel electrode 710 is disposed on the protective layer 180. The pixel electrode 710 is physically and/or electrically connected to the drain electrode 177 through the contact hole 81 disposed extended completely through the protective layer 180 to become an anode of an organic light emitting diode 70.

A pixel defining layer 350 is disposed on the protective layer 180 and an edge of the pixel electrode 710. A pixel opening 351 is defined in the pixel defining layer 350 and exposes the pixel electrode 710 therethrough. The pixel defining layer 350 may include resins such as polyacrylates or polyimides, and/or silica-based inorganic materials.

An organic light emitting layer 720 is disposed in the pixel opening 351 of the pixel defining layer 350. The organic light emitting layer 720 may be a monolayer, or a multi-layer structure. In one exemplary embodiment, for example, the organic light emitting layer 720 includes one or more of a light emitting layer, a hole injection layer ("HIL"), a hole transport layer ("HTL"), an electron transport layer ("ETL") and an electron injection layer ("EIL"). When the organic light emitting layer 720 includes all of the aforementioned layers, the HIL may be positioned on the pixel electrode 710 that functions as the anode of the organic light emitting diode 70. The HTL, the light emitting layer, the ETL and the EIL may be sequentially laminated thereon.

A common electrode 730 is disposed on the pixel defining layer 350 and the organic light emitting layer 720. The common electrode 730 may be a monolayer, or a multi-layer structure including a reflective layer including a reflective material or a semi-penetration layer. The common electrode 730 becomes a cathode of the organic light emitting diode 70. The pixel electrode 710, the organic light emitting layer 720 and the common electrode 730 collectively form the organic light emitting diode 70.

Only the second gate electrode connected to the first gate electrode is included the exemplary embodiment shown in FIG. 1. However, a further exemplary embodiment is feasible, in which a low resistance member connected to the second gate electrode is disposed at a position overlapping the second gate electrode on the third insulating layer.

Hereinafter, another exemplary embodiment of a TFT according to the invention will be described in detail with reference to FIG. 3.

Figure 3:
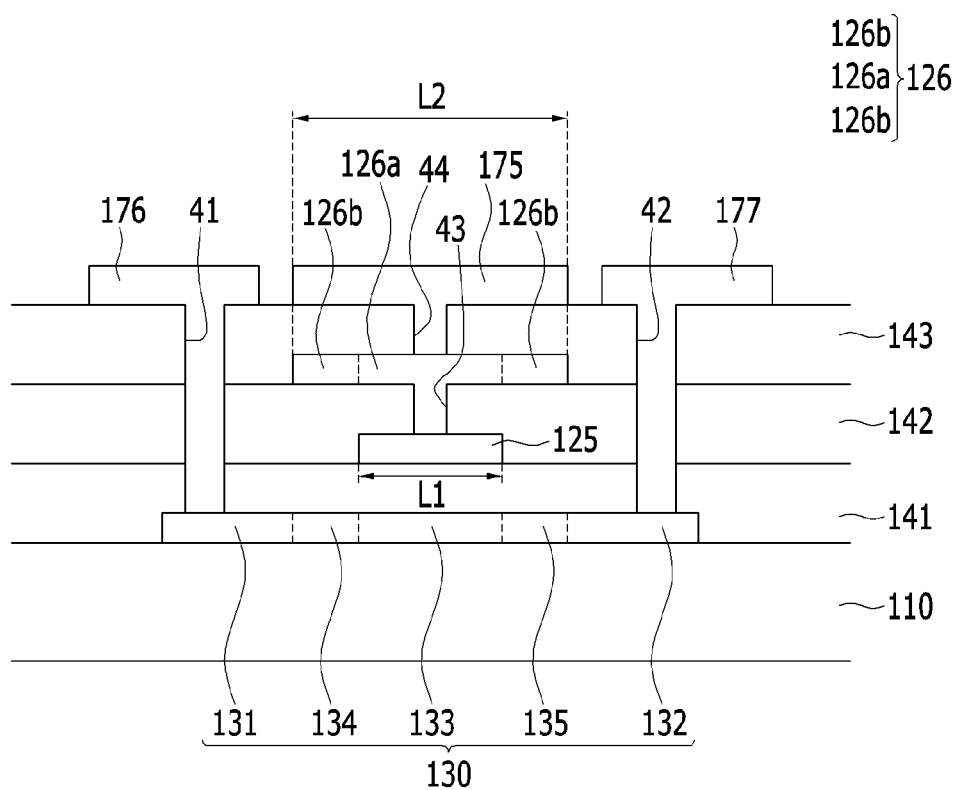
FIG. 3 is a cross-sectional view of another exemplary embodiment of a thin film transistor according to the invention.

FIG. 3 is a cross-sectional view of another exemplary embodiment of a TFT according to the invention.

The exemplary embodiment in FIG. 3 is substantially the same as the exemplary embodiment shown in FIG. 1, except that a low resistance member is further included. Accordingly, a repeated description thereof will be omitted.

As shown in FIG. 3, the third insulating layer 143 is disposed on the second gate electrode 126 and the second insulating layer 142 of the TFT. The third insulating layer 143 covers the second gate electrode 126 to insulate the second gate electrode 126.

The source electrode 176, the drain electrode 177 and a low resistance member 175 are disposed on the third insulating layer 143. The source electrode 176 and the drain electrode 177 are connected to the source region 131 and the drain region 132 of the semiconductor layer 130 through the contact holes 41 and 42 disposed extended through the first insulating layer 141, the second insulating layer 142 and the third insulating layer 143 and through which the source region 131 and the drain region 132 of the semiconductor layer 130 are exposed, respectively. In addition, the low resistance member 175 is disposed at a position overlapping the second gate electrode 126. A contact hole 44 is defined in the third insulating layer 143. The low resistance member 175 is physically and/or electrically connected to the second gate electrode 126 through the contact hole 44 disposed extended completely through a cross-sectional thickness of the third insulating layer 143.

Accordingly, the low resistance member 175, the second gate electrode 126 and the first gate electrode 125 may be connected to each other to reduce electrical resistance of the first gate electrode 125, thus preventing a resistive-capacitive ("RC") delay.

A further exemplary embodiment is feasible, in which the first gate electrode is divided into a first sub-gate electrode and a second sub-gate electrode spaced apart from each other.

Hereinafter, still another exemplary embodiment of a TFT according to the invention will be described in detail with reference to FIG. 4.

Figure 4:
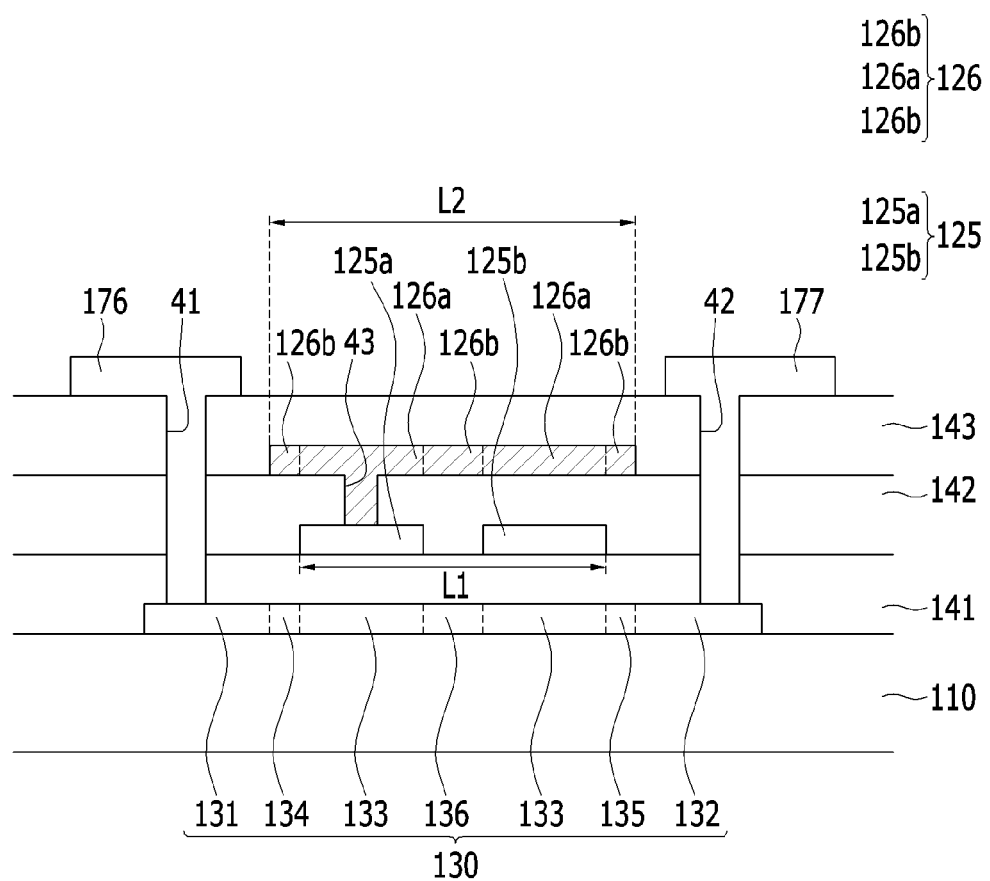
FIG. 4 is a cross-sectional view of still another exemplary embodiment of a thin film transistor according to the invention.

FIG. 4 is a cross-sectional view of still another exemplary embodiment of a TFT according to the invention.

The exemplary embodiment in FIG. 4 is substantially the same as the exemplary embodiment shown in FIG. 1, except that structures of the first gate electrodes are different. Accordingly, a repeated description thereof will be omitted.

As shown in FIG. 4, the semiconductor layer 130 of the TFT includes the source region 131, the drain region 132, the channel region 133 positioned between the source region 131 and the drain region 132, the weak electric field regions 134 and 135 positioned between the source region 131 and the channel region 133 and between the drain region 132 and the channel region 133, and a central weak electric field region 136 disposed at the center of opposing portions of the channel region 133.

The weak electric field regions 134 and 135 separate the source region 131 and the channel region 133, and the drain region 132 and the channel region 133, respectively. Reference numeral 133 may indicate an overall channel region or may indicate individual portions of an overall channel region. The central weak electric field region 136 divides the overall channel region 133 into two parts. As described above, the weak electric field regions 134 and 135 are disposed between the source region 131 and the channel region 133 and between the drain region 132 and the channel region 133, and the central weak electric field region 136 is disposed at the center of the overall channel region 133. Accordingly, when the TFT is in an off-state, an electron movement path in the semiconductor layer 130 may be blocked to further effectively prevent a leakage current from occurring.

The first insulating layer 141 including silicon nitride (SiNx) or silicon oxide (SiOx) is disposed on the substrate 110 and the semiconductor layer 130. The first gate electrode 125 is disposed on the first insulating layer 141. The first gate electrode 125 includes a first sub-gate electrode 125a and a second sub-gate electrode 125b spaced apart from each other and electrically connected to each other. FIG. 4 does not show a connection portion between the first sub-gate electrode 125a and the second sub-gate electrode 125b, which electrically connects the first sub-gate electrode 125a and the second sub-gate electrode 125b. However, the first sub-gate electrode 125a and the second sub-gate electrode 125b are physically and/or electrically connected to each other.

The first sub-gate electrode 125a and the second sub-gate electrode 125b are positioned to overlap the individual channel regions 133, respectively. The central weak electric field region 136 is positioned corresponding to an interval between the first sub-gate electrode 125a and the second sub-gate electrode 125b in the plan view.

The second insulating layer 142 including silicon nitride (SiNx) or silicon oxide (SiOx) is disposed on the first gate electrode 125 and the first insulating layer 141. The second insulating layer 142 covers the first sub-gate electrode 125a and the second sub-gate electrode 125*b* to insulate the first sub-gate electrode 125*a* and the second sub-gate electrode 125*b*.

The second gate electrode 126 is disposed on the second insulating layer 142. The second gate electrode 126 is positioned to overlap both the first sub-gate electrode 125*a* and the second sub-gate electrode 125*b*. The overall length L2 of the second gate electrode 126 may be larger than the overall length L1 of the first gate electrode 125. Both the first sub-gate electrode 125*a* and the second sub-gate electrode 125*b* are disposed at the internal side of the second gate electrode 126. The second gate electrode 126 includes overlapping second gate units 126*a* overlapping the first sub-gate electrode 125*a* and the second sub-gate electrode 125*b*, and non-overlapping second gate units 126*b* not overlapping (e.g., exposed by) the first sub-gate electrode 125*a* and the second sub-gate electrode 125*b*. The weak electric field regions 134 and 135 and the central weak electric field region 136 of the semiconductor layer 130 are disposed at positions corresponding to the non-overlapping second gate units 126*b*. The second gate electrode 126 is connected to the first sub-gate electrode 125*a* and the second sub-gate electrode 125*b* through the contact hole 43 disposed extended through the second insulating layer 142.

Accordingly, when a scan signal is applied to the first gate electrode 125 and the second gate electrode 126, only the first insulating layer 141 is disposed between the first sub-gate electrode 125*a* connected to overlap the overlapping second gate unit 126*a* and the second sub-gate electrode 125*b*, and the channel regions 133. Therefore, a strong electric field is formed between the first sub-gate electrode 125*a* and the second sub-gate electrode 125*b*, and the channel region 133, respectively. The first insulating layer 141 and the second insulating layer 142 are disposed between the non-overlapping second gate units 126*b*, and the weak electric field regions 134 and 135 and the central weak electric field region 136. Therefore, a weak electric field is formed between the non-overlapping second gate units 126*b*, and the weak electric field regions 134 and 135 and the central weak electric field region 136.

As described above, when the TFT is in an off-state, the weak electric field regions 134 and 135 and the central weak electric field region 136 block an electron movement path of the semiconductor layer 130 to further reduce a leakage of an electrical current and a hot electron effect, and increase a breakdown voltage.

The overall length L2 of the second gate electrode 126 is larger than the overall length L1 of the first gate electrode 125 in the exemplary embodiment of FIG. 4. However, a further exemplary embodiment is feasible, in which the overall length of the second gate electrode is smaller than the overall length of the first gate electrode.

Hereinafter, yet another exemplary embodiment of a TFT according to the invention will be described in detail with reference to FIG. 5.

Figure 5:
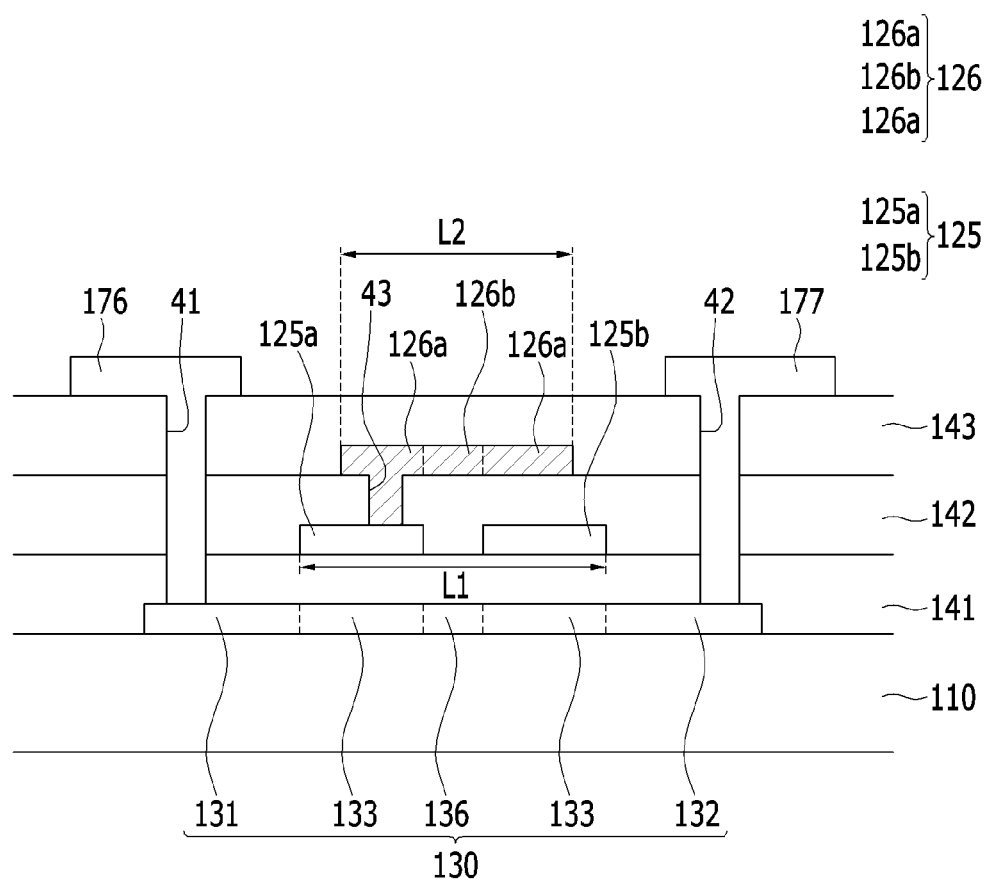
FIG. 5 is a cross-sectional view of yet another exemplary embodiment of a thin film transistor according to the invention.

FIG. 5 is a cross-sectional view of yet another exemplary embodiment of a TFT according to the invention.

The exemplary embodiment in FIG. 5 is substantially the same as the exemplary embodiment shown in FIG. 4, except that the overall length of the second gate electrode is smaller than the overall length of the first gate electrode. Accordingly, a repeated description thereof will be omitted.

As shown in FIG. 5, the semiconductor layer 130 of the TFT includes the source region 131, the drain region 132, the channel region 133 positioned between the source region 131 and the drain region 132, and the central weak electric field region 136 disposed at the center of the overall channel region 133. The central weak electric field region 136 divides the overall channel region 133 into two individual parts. As described above, the central weak electric field region 136 is disposed at the center of the channel region 133. Accordingly, when the TFT is in an off-state, an electron movement path in the semiconductor layer 130 may be blocked to reduce or effectively prevent a leakage of electrical current from occurring.

The first insulating layer 141 including silicon nitride (SiNx) or silicon oxide (SiOx) is disposed on the substrate 110 and the semiconductor layer 130. The first gate electrode 125 is disposed on the first insulating layer 141. The first gate electrode 125 includes the first sub-gate electrode 125*a* and the second sub-gate electrode 125*b* spaced apart from each other and electrically connected to each other. FIG. 5 does not show a connection portion between the first sub-gate electrode 125*a* and the second sub-gate electrode 125*b* for an electrical connection therebetween. However, the first sub-gate electrode 125*a* and the second sub-gate electrode 125*b* are physically and/or electrically connected to each other.

The first sub-gate electrode 125*a* and the second sub-gate electrode 125*b* are positioned to overlap the individual channel regions 133 of the overall channel region. The central weak electric field region 136 is positioned corresponding to an interval between the first sub-gate electrode 125*a* and the second sub-gate electrode 125*b*.

The second insulating layer 142 including silicon nitride (SiNx) or silicon oxide (SiOx) is disposed on the first gate electrode 125 and the first insulating layer 141. The second insulating layer 142 covers the first sub-gate electrode 125*a* and the second sub-gate electrode 125*b* to insulate the first sub-gate electrode 125*a* and the second sub-gate electrode 125*b*.

The second gate electrode 126 is disposed on the second insulating layer 142. The second gate electrode 126 is positioned to overlap the first sub-gate electrode 125*a* and the second sub-gate electrode 125*b*. The overall length L2 of the second gate electrode 126 may be smaller than the overall length L1 of the first gate electrode 125. A portion of the first sub-gate electrode 125*a* and the second sub-gate electrode 125*b* is disposed at a position corresponding to an outside of the second gate electrode 126, such that the second gate electrode 126 exposes portions of the first sub-gate electrode 125*a* and the second sub-gate electrode 125*b*. The second gate electrode 126 includes overlapping second gate units 126*a* overlapping the first sub-gate electrode 125*a* and the second sub-gate electrode 125*b*, and the non-overlapping second gate unit 126*b* not overlapping (e.g., exposed by) the first sub-gate electrode 125*a* and the second sub-gate electrode 125*b*. The central weak electric field region 136 of the semiconductor layer 130 is disposed at a position corresponding to the non-overlapping second gate unit 126*b*. The second gate electrode 126 is connected to the first sub-gate electrode 125*a* and the second sub-gate electrode 125*b* through the contact hole 43 disposed extended through the second insulating layer 142.

Accordingly, when a scan signal is applied to the first gate electrode 125 and the second gate electrode 126, only the first insulating layer 141 is disposed between the first sub-gate electrode 125*a* connected to overlap the overlapping second gate unit 126*a* and the second sub-gate electrode 125*b*, and the channel region 133. Therefore, a strong electric field is formed between the first sub-gate electrode 125*a* and the second sub-gate electrode 125*b*, and the channel region 133. The first insulating layer 141 and the second insulating layer 142 are disposed between the non-overlapping second gate unit 126*b* and the central weak electric field region 136. Therefore, a weak electric field is formed between the non-overlapping second gate unit 126*b* and the central weak electric field region 136.

As described above, when the TFT is in an off-state, the central weak electric field region 136 blocks an electron movement path of the semiconductor layer 130 to further reduce a leakage of electrical current and a hot electron effect, and increase a breakdown voltage.

Only the second gate electrode connected to the first gate electrode is included in the exemplary embodiment shown in FIG. 5. However, a further exemplary embodiment is feasible, in which the low resistance member connected to the second gate electrode is disposed on the third insulating layer.

Hereinafter, yet another exemplary embodiment of a TFT according to the invention will be described in detail with reference to FIG. 6.

Figure 6:
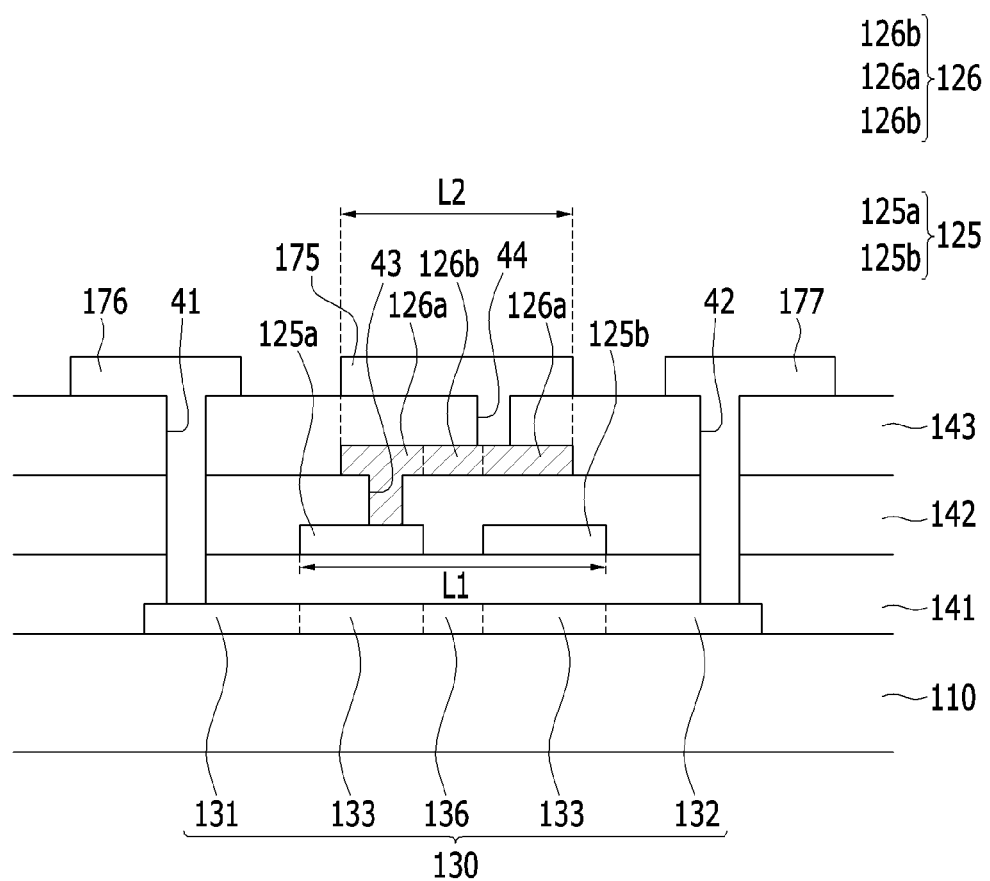
FIG. 6 is a cross-sectional view of yet another exemplary embodiment of a thin film transistor according to the invention.

FIG. 6 is a cross-sectional view of yet another exemplary embodiment of a TFT according to the invention.

The exemplary embodiment of FIG. 6 is substantially the same as the exemplary embodiment shown in FIG. 5, except that the low resistance member is further included. Accordingly, a repeated description thereof will be omitted.

As shown in FIG. 6, the third insulating layer 143 is disposed on the second gate electrode 126 and the second insulating layer 142 of the TFT. The third insulating layer 143 covers the second gate electrode 126 to insulate the second gate electrode 126.

The source electrode 176, the drain electrode 177 and the low resistance member 175 are disposed on the third insulating layer 143. The source electrode 176 and the drain electrode 177 are connected to the source region 131 and the drain region 132 of the semiconductor layer 130 through the contact holes 41 and 42 disposed extended through the first insulating layer 141, the second insulating layer 142 and the third insulating layer 143, and through which the source region 131 and the drain region 132 of the semiconductor layer 130 are exposed, respectively. In addition, the low resistance member 175 is disposed at a position overlapping the second gate electrode 126. The low resistance member 175 is connected to the second gate electrode 126 through the contact hole 44 disposed extended through the third insulating layer 143.

Accordingly, the low resistance member 175, the second gate electrode 126 and the first gate electrode 125 may be connected to each other to reduce resistance of the first gate electrode 125, thus preventing an RC delay.

While the invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A thin film transistor comprising:
 a substrate;
 a semiconductor layer on the substrate;
 a gate electrode overlapping the semiconductor layer while being insulated from the semiconductor layer;
 a conductor layer comprising:
 a source electrode and a drain electrode spaced apart from each other along a first direction, each of the source electrode and the drain electrode connected to the semiconductor layer while being insulated from the gate electrode, and
 a first conductor electrically connected with the gate electrode and spaced apart from the source and drain electrodes along the first direction, while being insulated from the source and drain electrodes, and
 a second conductor between the gate electrode and the first conductor, and connecting the gate electrode and the first conductor to each other; and
 a first insulating layer respectively between the second conductor, and each of the source electrode, the drain electrode and the first conductor,
 wherein along the first direction, a length of the first conductor and a length of the second conductor are both larger than a length of the gate electrode.

2. The thin film transistor of claim 1, wherein the first insulating layer extends from the conductor layer to be overlapped by each of the source electrode and the drain electrode.

3. The thin film transistor of claim 1, wherein the second conductor comprises an overlapping portion which overlaps the gate electrode and a non-overlapping portion which does not overlap the gate electrode.

4. The thin film transistor of claim 3, wherein the semiconductor layer comprises:
 a source region which contacts the source electrode;
 a drain region which contacts the drain electrode;
 a channel region which is provided between the source region and the drain region; and
 a weak electric field region which is disposed corresponding to the non-overlapping portion of the second conductor.

5. The thin film transistor of claim 4, wherein within the semiconductor layer, the weak electric field region is disposed between the source region and the channel region and between the drain region and the channel region.

6. The thin film transistor of claim 5, wherein
 the source region in contact with the source electrode is disposed non-overlapping with both the overlapping portion and the non-overlapping portion of the second conductor,
 the drain region in contact with the drain electrode is disposed non-overlapping with both the overlapping portion and the non-overlapping portion of the second conductor, and
 the weak electric field region disposed corresponding to the non-overlapping portion of the second conductor extends from the channel region to an outer edge of the non-overlapping portion of the second conductor.

7. The thin film transistor of claim 1, wherein the first insulating layer defines a first contact hole at which the first conductor and the second conductor are connected to each other, the first insulating layer extending from the first contact hole to be overlapped by each of the source electrode and the drain electrode.

8. The thin film transistor of claim 7, further comprising a second insulating layer defining a second contact hole at which the second conductor and the gate electrode are connected to each other, the second insulating layer extending from the second contact hole to be overlapped by each of the source electrode and the drain electrode.

9. An organic light emitting diode display comprising:
 the thin film transistor of claim 1;
 a capacitor; and
 an organic light emitting diode connected to the thin film transistor.

10. The thin film transistor of claim 1, wherein disposed along a thickness direction of the substrate are disposed overlapping each other, in order: the gate electrode, the second conductor, the first insulating layer and the first conductor.

11. The thin film transistor of claim 1, wherein a portion of the second conductor connecting the gate electrode to the first conductor, extends through a thickness of the first insulating layer to meet the first conductor within the first insulating layer.

* * * * *